United States Patent [19]

Gudger et al.

[11] Patent Number: 5,079,451
[45] Date of Patent: Jan. 7, 1992

[54] PROGRAMMABLE LOGIC DEVICE WITH GLOBAL AND LOCAL PRODUCT TERMS

[75] Inventors: Keith H. Gudger, Sunnyvale; Geoffrey S. Gongwer, San Jose, both of Calif.

[73] Assignee: Atmel Corporation, San Jose, Calif.

[21] Appl. No.: 626,999

[22] Filed: Dec. 13, 1990

[51] Int. Cl.⁵ .......................................... H03K 19/177
[52] U.S. Cl. .................................. 307/465.1; 307/465
[58] Field of Search ............. 307/443, 465, 468, 469, 307/465.1; 340/825.83

[56] References Cited

U.S. PATENT DOCUMENTS

| | | | |
|---|---|---|---|
| 4,609,986 | 9/1986 | Hartmann et al. | 364/200 |
| 4,736,333 | 4/1988 | Mead et al. | 364/736 |
| 4,894,563 | 1/1990 | Gudger | 307/465 |
| 4,906,870 | 3/1990 | Gongwer | 307/465 |
| 4,963,768 | 10/1990 | Agrawal et al. | 307/465 |
| 4,992,680 | 2/1991 | Benedetti et al. | 307/465.1 X |
| 5,003,200 | 3/1991 | Sakamoto | 340/825.83 X |
| 5,015,884 | 5/1991 | Agrawal et al. | 307/465 |

OTHER PUBLICATIONS

Long, "Input Bus Switching for PLA", *IBM T. D. B.*; vol. 20, No. 3 Aug. 1977 p. 1062.
Atmel Corp., "Atmel High Density UV Erasable Programmable Logic Device, ATV2500," data sheet, Jan. 1988.

*Primary Examiner*—David Hudspeth
*Attorney, Agent, or Firm*—Schneck & McHugh

[57] ABSTRACT

A programmable logic device having a programmable AND (product term) array formed with input terms on both global and local busses and with both global and local product term lines. Each macrocell of the device, whether as input/output macrocell connected to an I/O pin or a buried macrocell providing only feedback, connects to and receives an inputs both global and local product terms. In one embodiment, global product terms are connectable to the global bus and to a local bus corresponding to a particular group or quadrant of macrocells. Local product terms are only connectable to that local bus, and thus only a fraction of the terms available to the global product terms. In an alternate embodiment, global product terms are connectable to the global bus and to a set of local busses which is a prope subset of all of the local busses. Local product terms are connectable only to the particular local bus assigned to a particular group or quadrant of macrocells and to a fraction of the terms on the global bus.

21 Claims, 4 Drawing Sheets

PROGRAMMABLE LOGIC DEVICE WITH GLOBAL AND LOCAL PRODUCT TERMS

DESCRIPTION

1. Technical Field

The present invention relates to programmable logic devices (PLDs), such as programmable logic arrays (PLAs) and programmable array logic (PALs), and in particular is directed at that aspect of PLD architecture which relates to the connecting and routing of inputs to and outputs from the plural macrocells in a PLD.

2. Background Art

Many programmable logic devices (PLDs), whether PLAs or PALs, are commercially available. Atmel Corporation's V2500 is one such device. The V2500 is organized around a global bus, so that all pin and feedback terms are available to every product term and macrocell. The device has 14 input pins and 24 I/O pins providing 76 input terms, and feedback lines from pairs of flip-flops in each of the 24 macrocells providing 96 input terms, for a total of 172 input terms in the programmable AND array. Each macrocell is provided with 4 product terms for each of its three OR gates, 1 asynchronous reset product term and 1 clock product term for each of its two flip-flops and 1 output enable product term, for a total of 17 product terms per macrocell. There are also 8 synchronous preset product terms. Thus, the programmable AND array must provide 416 product terms. The AND array thus needs 172×416 or about 70K programmable interconnections. A problem with PLD architectures that organize pin input and macrocell feedback terms around a global bus is that the size of the PLD grows exponentially as the number of inputs increases.

Modifications to the basic PLD architecture have been made in some devices. In Altera Corporation's PLDs, inputs to macrocells, each of which includes a programmable AND array, are received from input busses that are divided into global and local input busses. The global input busses are connected to every macrocell, while local input busses are connected to only some of the macrocells in the device. All product terms of any one macrocell connect to the same set of global and local input busses.

For example, in U.S. Pat. No. 4,609,986, Hartmann et al. describe a PLA (embodied by Altera's EP1200 device) having a plurality of macrocells. Input signals received through input terminals are supplied on a global input bus to the inputs of every macrocell. Each macrocell includes an AND array matrix of EPROM transistors configured to form a plurality of product term signals in response to signals on its inputs. The product terms are in turn fed into OR gates, the outputs of which forming data signals representing "sum-of-products" expressions of the inputs to the AND arrays. Some product terms are dedicated to a particular OR gate, while others may be shared by two OR gates. The macrocells also include D flip-flop registers for storing the data signals, multiplexers for selecting the destinations of the stored or unstored signals and driver circuits. The outputs of some macrocells may be transmitted as output signals through I/O terminals, while other macrocells are buried. The outputs of some macrocells can feedback through a global feedback bus to the inputs of every macrocell, while the outputs of other macrocells can feedback through local feedback busses to the inputs of only some macrocells. Every product term in a given macrocell connects to the same set of input terms provided by the global and local busses.

The modified architecture, by limiting the reach of outputs that are fed back from some macrocells, reduces the number of inputs to each macrocell, and so the AND array in each macrocell grows less rapidly than it would otherwise. However, further reduction in the number of required AND array interconnections for a given number of input pins and macrocells is sought.

An object of the present invention is to provide a programmable logic device having a reduced number of required programmable interconnections and a more linear growth in die area for each additional input or I/O pin without a loss of functional flexibility of the device.

DISCLOSURE OF THE INVENTION

The above object has been met with a programmable logic device whose architecture includes both global and local product terms in every macrocell. Input terms are provided on global and local busses, the reach of any local input bus being limited to the product terms of only some macrocells, while the input terms provided on the global input bus are available to product terms of every macrocell. Unlike previous PLD architectures, every product term in any given macrocell is not connected to the same set of input terms provided by the global and local busses. In one embodiment, some number of product terms in the macrocell, designated as "global" product terms, have all inputs available to them from both the global input bus and the particular local input bus assigned to the product terms of that macrocell, while some number of other product terms in the same macrocell, designated as "local" product terms, have only local inputs available to them from the particular local input bus assigned to the product terms of that macrocell. In that embodiment, local product terms are not connectable to the global input bus. Thus, some product terms in a macrocell are connectable to both global and local busses, whereas others are only connectable to the local bus. This reduces the number of required interconections and hence the die area. By limiting the reach of some inputs to the macrocells, the architecture allows the AND array to grow at close to a linear relationship with respect to the total number of inputs, and thereby raises the practical limit of input and I/O pins to nearly double the limit of previous PLD architectures.

In an alternate embodiment, each macrocell is again connected to both global and local product terms. "Global" product terms are connectable to the global bus and to some proper subset of local busses. "Local" product terms are connectable to the particular local bus corresponding to a particular group of macrocells or quadrant. Local product terms may also be connectable to some fraction of the input terms on the global bus, but not all of the global bus terms. Thus local product terms are connectable to only some of the input terms that global product terms for the same macrocell can connect to. This also results in a savings in the number of required interconnections without a substantial loss in flexibility for a given combination of inputs, input/output pins, macrocells for output or buried, macrocell product term requirements and the like. In fact, since the number of pins and macrocells may be increased, due to the savings in interconnections, flexibility may actually improve.

BEST MODE FOR CARRYING OUT THE INVENTION

Figure 1:
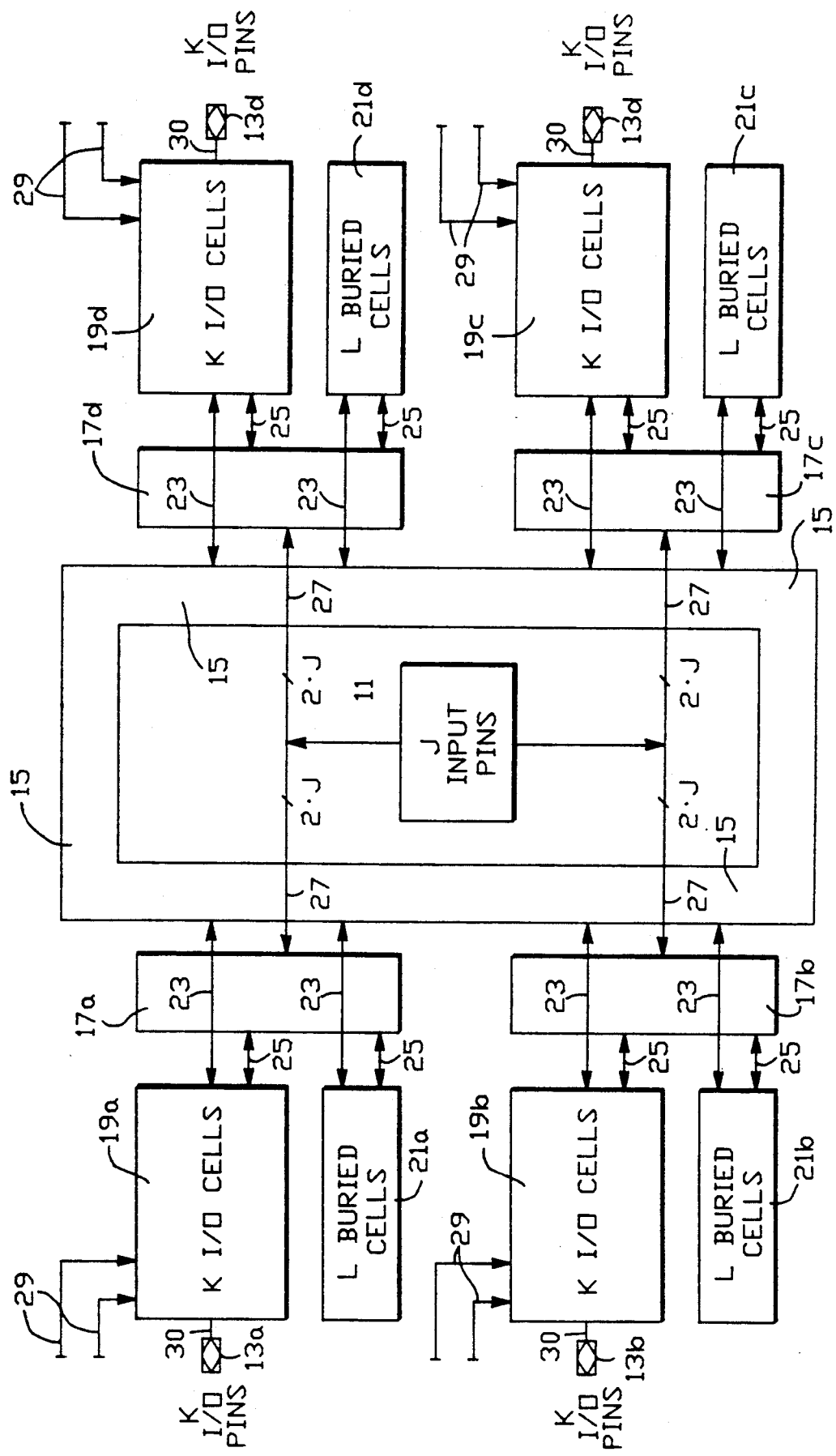
FIGS. 1 and 2 are respective schematic and block diagrams of a programmable logic device architecture of the present invention showing how busses interact with various macrocells and groups of macrocells or quadrants in the device.

With reference to FIG. 1, a programmable logic device (PLD) of the present invention, such as a programmable logic array (PLA) or programmable array logic (PAL) device, has a plurality of pins, including input pins 11 and input/output pins 13a-d, for receiving input signals from outside the device and transmitting output signals out of the device. The term "pins" includes any of the various terminal means used in the integrated circuit art for coupling electrical signals into or out of an integrated circuit device, such as pins, J-leads, contact pads, etc. The number J of input pins 11 and the number 4.K of input/output pins 13a-d may vary from device to device. However, typically there are a total of J=8 to 16 input pins 11 in a device and a number K=4 to 16 input/output pins 13a-d per quadrant.

The PLD device also includes a global bus 15 and four regional or local busses 17a-d, i.e. one regional or local bus for each quadrant. The device further includes a plurality of macrocells, some of which are input/output cells 19a-d and others of which are buried cells 21a-d. The macrocells 19 and 21 are organized into groups, here four in number forming quadrants. A first quadrant includes a number K input/output cells 19a, a number L buried cells 21a, and an associated regional or local bus 17a. A second quadrant also includes K input/output cells 19b, L buried cells 21b and an associated regional or local bus 17b. Similarly, a third quadrant includes K input/output cells 19c, L buried cells 21c and an associated regional or local bus 17c. A fourth quadrant, likewise, includes K input/output cells 19d, L buried cells 21d and an associated regional or local bus 17d. The number K of input/output cells 19a-d in each quadrant or group is typically identical to the number of input/output pins 13a-d in each quadrant or group, since normally each input/output cell 19a-d is associated with one and only one input/output pin 13a-d. Accordingly, there are typically from K=4 to 16 input/output cells 19a-d per quadrant. The number L of buried cells 21a-d in each quadrant may vary from L=1 to 12 per quadrant. The numbers K and L of cells are typically the same for each quadrant, but could also differ from one group or quadrant to the next.

Figure 2:
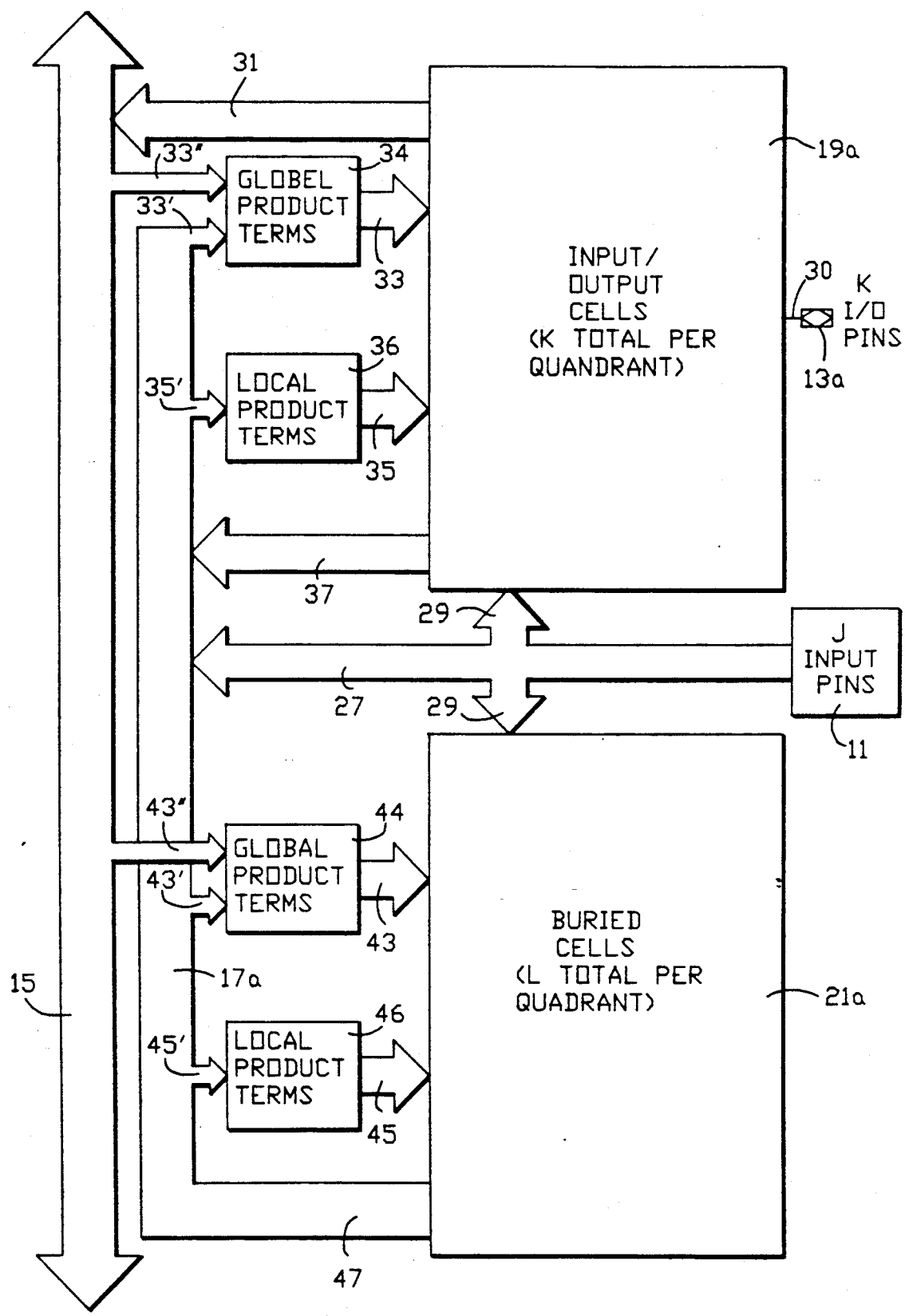

The macrocells 19 and 21 are connected to the busses 15 and 17a-d via a set of signal conductive lines 23 and 25. A more detailed view of the connections, exemplified by the connections for the first quadrant, is shown in FIG. 2. The connections for the other quadrants or groups is substantially similar. In FIGS. 1 and 2, input pins 11 connect via lines 27 to each of the regional or local busses 17a-d. The J pins provide 2.J signals to each of the local busses, one signal being provided by each input pin 11 as it is received, the other signal provided by each input pin 11 being an inverted or logical complement to the signal received by that pin. The signals received by the input pins 11 are also provided to each of the macrocells 19 and 21 on lines 29 for use as register or latch clock signals. For purposes of providing these clock signals, the input pins 11 are typically assigned to particular macrocell groups, so that if, for example, the number J of input pins 11 is eight, then each macrocell quadrant will receive clock inputs on lines 29 from a different pair of input pins 11 than the other quadrants. The input/output pins 13a-d are connected to input/output cells 19a-d via signal conductive lines 30, one pin per cell. The input/output cells 19a include programmable elements, such as EPROMs, for providing control bits that select whether an associated input/output pin 13a is to receive an input signal or transmit an output signal. Cells in other quadrants work in the same way. Any input signals received by the input/output pins 13a are passed along input lines 31 to the global bus 15, from which they are made available to every quadrant. Input lines 31 in FIG. 2 form one part of the lines 23 in FIG. 1 connecting the macrocells to the global bus 15.

The K input/output cells 19a connect to the global bus 15 and to the corresponding local bus 17a for their quadrant in order to receive "global" product term signals on global product term lines 33. The global product term signals are derived in a programmable AND matrix 34 from input signals on lines 33' and 33" of the busses 17a and 15. The input/output cells 19a connect to the local bus 17a to receive "local" product term signals on local product term lines 35. The local product term signals are derived in a programmable AND matrix 36 from input signals on lines 35' of the local bus 17a. The input/output cells 19a also connect to the local bus 17a to provide feedback signals on feedback lines 37 to the corresponding local bus 17a for their quadrant.

The L buried cells 21a are likewise connected to the global bus 15 and to the corresponding local bus 17a for their quadrant so as to receive global product term signals on global product term lines 43. The global product term signals are derived in a programmable AND matrix 44 from input signals on lines 43' and 43" of the busses 17a and 15. The buried cells 21a are connected to the corresponding local bus 17a to receive local product term signals on local product term lines 45. The local product term signals are derived in a programmable AND matrix 46 from input signals on lines 45' of local bus 17a. The buried cells 21a also feed back signals on feedback lines 47 to the local bus 17a of their quadrant.

From the description just given of the connections between the busses 15 and 17a and the macrocells 19a and 21a, it is seen that lines 23 in FIG. 1 correspond to input lines 31 and global product term lines 33 for the input/output cells 19a, and to the global product term lines 43 for buried cells 21a in FIG. 2. Likewise, lines 25 in FIG. 1 correspond to the local product term lines 35 and the feedback lines 37 for the input/output cells 19a, and to the local product term lines 45 and feedback lines 47 for the buried cells 21a in FIG. 2.

The AND matrices 34, 36, 44 and 46 in FIG. 2 for producing the global and local product term signals on lines 33, 35, 43 and 45, while conceptually distinct from the busses 15 and 17a in terms of function, are typically structurally integral with the busses 15 and 17a, and thus are not shown explicitly as a separate element in FIG. 1. Further, the global and local AND matrices 34 and 36, and similarly the functionally distinct global and local AND matrices 44 and 46, are not typically located in physically distinct areas, but rather substantially overlap one another when viewed structurally. Thus, in the more detailed view of the first quadrant seen in FIG. 3, the programmable AND matrices appear as a set of programmable interconnections, represented by X's 49, located where the product term lines 33, 35, 43 and 45 cross bus lines in the busses 15 and 17a. The bus lines are not shown in FIG. 3 but run parallel to one another along the length of the busses 15 and 17a (top to bottom in FIG. 3), and directly connect to input lines 27, 31, 37 and 47 into the busses. The bus lines in global bus 15 continue to all quadrants, while the bus lines in local bus 17a are present only in the one quadrant. Programmable interconnections 49 may be composed of a set of mask programmable connections, fuses, EPROMs or EEPROMs laid out in the manner well known in the PLD art and programmed according to well known techniques.

The global product term lines 33 extend across both the global bus 15 and the local bus 17a for the corresponding quadrant. The global product term lines 33 are programmably connectable, therefore, to both the global and local bus and to any of the bus lines available to that quadrant. The local product term lines 35 extend only across the local bus 17a for the quadrant, and not into the global bus 15. Thus, the local product term lines 35 are programmably connectable only to the local bus, i.e. to any of the bus lines in the local bus 17a, and only to some of the bus lines available to the quadrant. The relationship holds between the busses 15 and 17a and the global and local product term lines 43 and 45 associated with the buried cells 21a of the quadrant. Global product term lines 43 extend across and are programmably connectable to any of the bus lines in both the global bus 15 and the local bus 17a corresponding to the quadrant. Local product term lines 45 extend across and are programmably connectable to the bus lines in only the local bus 17a.

Figure 3:
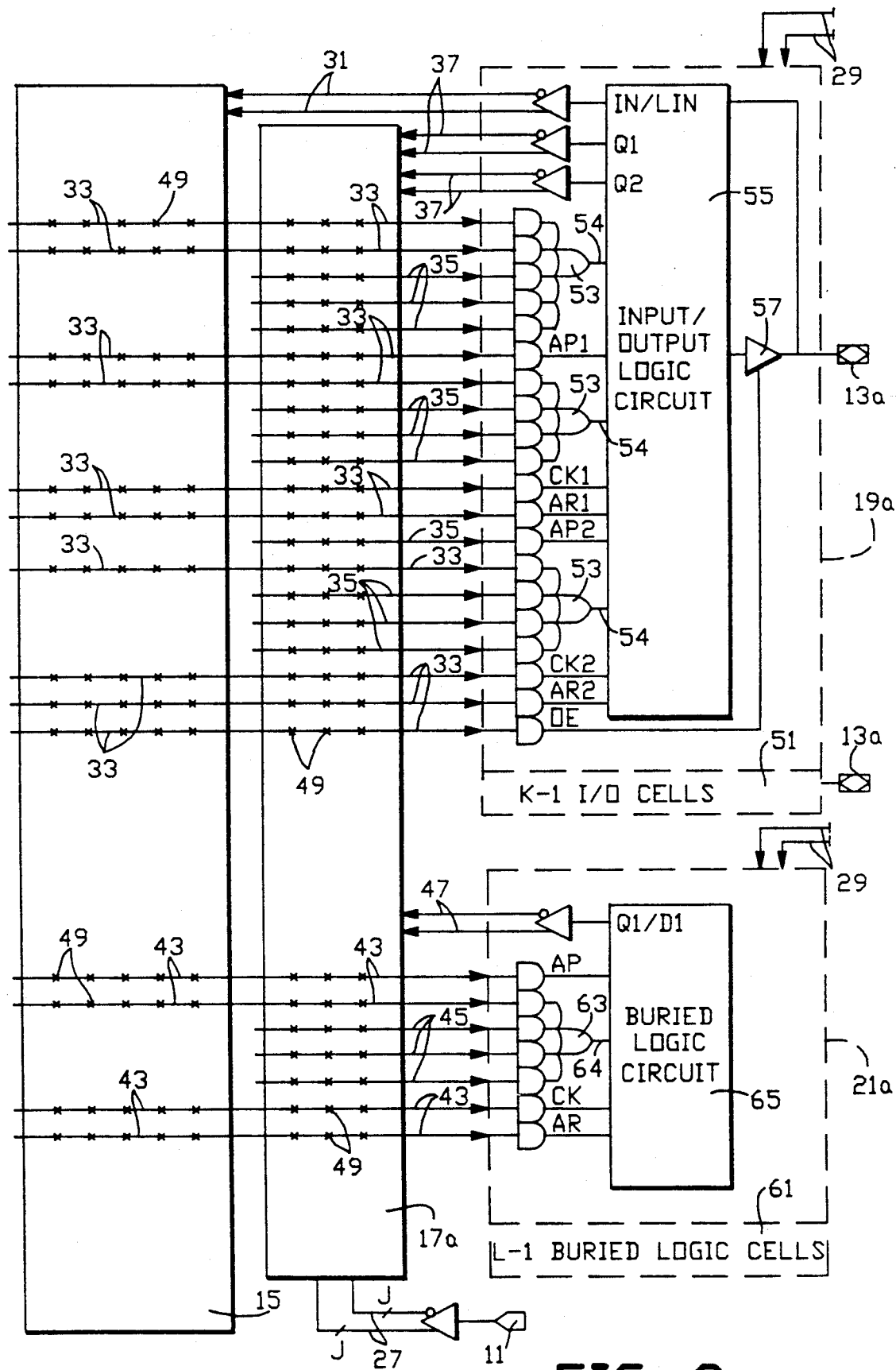
FIG. 3 is a detailed schematic diagram of one quadrant in the architecture of FIG. 1.

In FIG. 3, one of the K input/output cells 19a is shown in somewhat greater detail. The other (K-1) input/output cells 51 are substantially similar to the one shown in detail. Each input/output cell has a set of OR logic gates 53 receiving product term signals from product term lines 33 and 35 as their inputs and producing data signals representing a sum-of-products expression on their outputs 54. The number of product term lines connected to any given OR logic gate may vary. Preferably, each OR gate 53 has inputs available from both global product term lines 33 and local product term lines 35. The OR gate outputs feed into an input/output logic circuit 55 containing storage registers, latches and multiplexers along with control bits in the form of EPROM transistor switches or the like. The logic circuit 55 may be constructed in a conventional way, such as the way shown in FIG. 3 of the aforementioned U.S. Pat. No. 4,609,986 to Hartmann et al., or the in the manner taught in U.S. Pat. Nos. 4,894,563 to Gudger and 4,906,870 to Gongwer, both of the latter assigned to the assignees of the present invention. Product terms that are programmed to form asynchronous preset, asynchronous reset, clock signals for the logic circuit's storage registers and output enable signals are also supplied to the input/output cells 19a. Typically, these signals are formed on global product term lines 33, but this is not essential in all cases. The operation of the logic circuit 55 results in a number of possible data signals, stored and unstored, for output. Some stored signals may be fed back to the local bus 17a by feedback lines 37. If an output buffer 57 is enabled by an output enable signal OE, then a data signal from the input/output logic circuit 55 provided to buffer 57 is transmitted through a corresponding input/output pin 13a associated with that logic cell 19a. If the output buffer 57 is not enabled, and control signals provided by EPROMs or the like in logic circuit 55 couple the input/output pin 13a to input lines 31, then the pin 13a can be used to receive an input signal and transfer it, together with its complement, to the global bus 15. Input lines 31 might also be capable of being switched from receiving an input signal from input/output pin 13a to carrying logic signals, such as the output 54 from one of the OR gates 53 of the macrocell 19a. Global bus 15 would then receive some logic cell signals. The remaining K-1 input/output logic cells 19a in the quadrant are substantially similar to the one just described.

The L buried logic cells 21a are somewhat similar in construction to the K input/output cells 19a with the basic difference that buried cells 21a do not connect to any input/output pins 13a. Each buried logic cell 21a includes one or more of gates 63 having product term lines 43 and 45 as inputs and providing an output signal on an output line 64 from each OR gate or gates representing a sum-of-products expression derived from selected input signals on busses 15 and 17a. Preferably, each OR gate 63 has product term line inputs from both the global product term lines 43 and the local product term lines 45. Each buried logic cell 21a includes a buried logic circuit 65 into which the output or outputs 64 of the OR gate or gates 63 feed. The logic circuit 65 contains one or more storage registers, latches and multiplexers along with control bits in the form of EPROM transistor switches or the like. Buried logic circuits 65 may, like logic circuits 55, be constructed in an entirely conventional way known in the art. The buried logic circuits 65 are supplied with an asynchronous preset signal (AP), an asynchronous reset signal (AR) and a clock signal (CK) from the product term lines 43 or 45 for use by the storage register or registers. Usually these signals are formed on global product term lines 43. The operation of the logic circuit 65 results in a number of possible data signals, stored or unstored, for feedback. One or more of these signals, together with their complements, may be fed back along lines 47 to the local bus 17a. The remaining L-1 buried logic cells 21a are substantially similar to the one shown and described.

Figure 4:
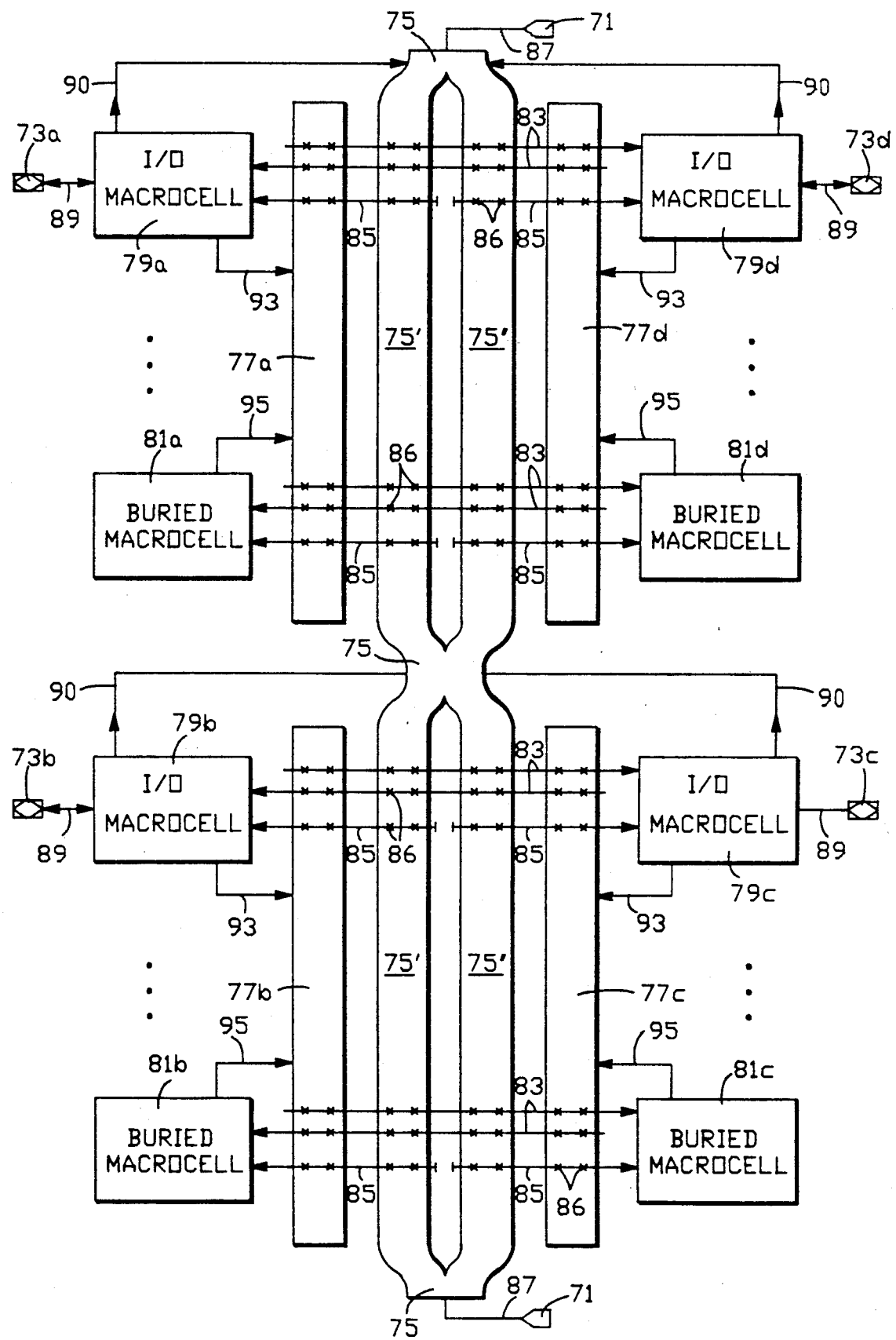
FIG. 4 is a schematic diagram of a second programmable logic device architecture of the present invention.

With reference to FIG. 4, an alternate embodiment of a PLD of the present invention also employs local and global product terms in each macrocell. The device includes input pins 71 providing input signals on input lines 87 to a global bus 75 and input/output pins 73a-d organized into groups or quadrants associated with particular groups or quadrants of input/output macrocells 79a-d and transmitting output signals on input/output lines 89 from the macrocells 79a-d to the exterior of the device. The input/output pins 73a-d may also be used to receive input signals and transfer them via input/output lines 89 and input lines 90 to the global bus 75. The device also includes a set of local busses 77a-d, each one associated with a particular macrocell group or quadrant. Some macrocells are input/output macrocells 79a-d, each having an associated input/output pin 73a-d, while other macrocells are buried macrocells 81a-d not connectable to any input/output pins 73a-d. Both types of macrocell, input/output 79a-d and buried 81a-d, are able to feed back data signals on respective feedback lines 93 and 95 to a local bus 77a-d associated with that macrocell's group or quadrant. Thus, the global bus 75 carries signals from the pins 71 and 73a-d, while the local busses 77a-d carry feedback signals from their group's macrocells 79a-d and 81a-d. Input lines 90 to the global bus might also be capable of being switched from carrying signals from input/output pins 73a-d to carrying logic signals from macrocells 79a-d. Thus, the global bus 75 could also carry logic cell signals.

Each macrocell 79a-d and 81a-d receives both global product term lines 83 and local product term lines 85 as inputs. In this embodiment, there are four groups of macrocells, called "quadrants", which are further organized into top and bottom halves, as well as left and right halves. Macrocells 79a, 81a, 79d and 81d are in the "top" half of the device. Macrocells 79b, 81b, 79c and 81c are in the "bottom" half of the device. Macrocells 79a, 81a, 79b and 81b are in the "left" half of the device. Macrocells 79c, 81c, 79d and 81d are in the "right" half of the device. The local busses 77a-d are similarly organized into top and bottom halves corresponding to the halves of their respective macrocells. The global bus 75 is in turn organized into a left half 75' and a right half 75''.

Global product term lines 83 are connectable via programmable switches 86, such as EPROMs, to input lines of both halves 75' and 75'' of the global bus and to input lines of the local busses 77a and 77d (or 77b and 77c) corresponding to the top or bottom half to which their assigned macrocell belongs. Thus, global product term lines 83 which connect to any of the top half macrocells 79a, 81a, 79d or 81d are programmably connectable to input lines in both left and right halves 75' and 75'' of the global bus 75 and to input lines in both top half local busses 77a and 77d. Similarly, global product term lines 83 which connect to any of the bottom half macrocells 79b, 81b, 79c or 81c are programmably connectable to input lines in both left and right halves 75' and 75'' of the global bus 75 and to input lines in both bottom half local busses 77b and 77c. Global product term lines 83 for the top half macrocells are not connectable to either local bus of the bottom half 77b or 77c, and those for the bottom half macrocells are not connectable to either local bus of the top half 77a or 77d. In this sense the local busses 77a-d are not global, since no local bus is connectable to every macrocell, but only to those macrocells of the corresponding top or bottom half.

Local product term lines 85 are connectable via programmable switches 86, such as EPROMs, to input lines of the local bus 77a-d corresponding to the quadrant to which their assigned macrocell belongs and to input lines of that half of the global bus 75' or 75'' corresponding to their macrocell. Thus, local product term lines 85 which connect to any macrocell 79a or 81a of a first quadrant in the top and left halves of the device are connectable to input lines of corresponding local bus 77a and to the input lines of the left half 75' of global bus 75. Local product term lines 85 which connect to any macrocell 79b or 81b of a second quadrant in the bottom and left halves of the device are connectable to input lines of corresponding local bus 77b and to input lines of the left half 75' of global bus 75. Local product term lines 85 which connect to any macrocell 79c or 81c of a third quadrant in the bottom and right halves of the device are connectable to input lines of corresponding local bus 77c and to input lines of the right half 75'' of global bus 75. Local product term lines 85 which connect to any macrocell 79d or 81d of a fourth quadrant in the top and right halves of the device are connectable to input lines of corresponding local bus 77d and to input lines of the right half 75'' of global bus 75. Local product term lines 85 are not connectable to any local bus 77a-d other than the one for the quadrant corresponding to its particular macrocell 79a-d or 81a-d. Local product term lines 85 are also not connectable to all of the input lines on the global bus 75, but only to those of its corresponding left or right half 75' or 75''. Thus, local product term lines 85 are connectable to substantially fewer input lines than the global product term lines 83 for the same macrocell.

As a particular example of the advantages of the architectures of the present invention, we consider a device which has 8 input pins, 52 input/output pins, 52 input/output macrocells and 24 buried macrocells. Each input/output macrocell has 3 OR gates, requires 20 product term inputs and supplies 4 feedback terms. Each buried macrocell has 1 OR gate, requires 7 product term inputs and supplies 2 feedback terms.

For a V2500 type architecture of the prior art having only a global bus, there would be a total of 376 input terms on the bus, 16 from the input pins, 104 from the input/output pins, 208 from the I/O macrocell feedbacks and 48 from the buried macrocell feedbacks. There would also be 1208 total product terms provided, 1080 for the I/O macrocells and 168 for the buried macrocells. Thus, such a device would require 376×1208 or about 443K interconnections.

For an Altera type architecture of the prior art and described in the above noted Hartmann et al. patent, which provides global and local busses, but only global product terms, there would still be 1208 product terms, as provided above for the V2500 architecture. However, each product term would only be connectable to 220 input terms, 16 on the global bus from the input pins, 52 on each local bus from the input/output pins, 104 on each local bus from the I/O macrocell feedbacks and 48 on the global bus from the buried macrocell feedbacks. Thus, such a device would require 220×1208 or about 260K interconnections, for a savings of over 40%.

For the architecture of the present invention shown in FIG. 4, there would be a global bus with 120 input terms, 16 from the input pins and 104 from the input/output pins. The global bus could be divided into left and right halves with 60 terms each. There would also be a local bus for each quadrant, each local bus having 64 input terms, 52 from feedbacks from that quadrant's I/O macrocells and 12 from feedbacks from that quadrant's buried macrocells. Each I/O macrocell would require 10 global product terms, while each buried macrocell would require 4 global product terms, for a total of [(13×10)+(6×4)]or 154 global product terms per quadrant. Each I/O macrocell would also require 10 local product terms and each buried macrocell would also require 3 local product terms for a total of [(13×10)+(6×3)]or 148 local product terms per quadrant. Thus, the device would require (4 quadrants){(154) [120+128]+(148) [60+64]} or about 220K interconnections. This represents a 50% savings over the original V2500 architecture and an extra 15% savings over the Altera architecture.

The preferred architecture shown in FIGS. 1-3 has a global bus with 104 input terms from the input/output pins. There are four local busses, each with 80 input terms, 16 from the input pins (these input terms go to each local bus), 52 from feedbacks from that quadrant's I/O macrocells and 12 from feedbacks from that quadrant's buried macrocells. As with the FIG. 4 embodiment described above, each quadrant would require 154 global product terms and 148 local product terms. Each global product term is connectable to the 104 global bus input terms and 80 input terms from one local bus, and thus requires 184 connections. Each local product term is connectable only to the 80 inputs from the corresponding local bus. Thus, the device requires (4 quadrants) {(154) (184)+(148) (80)} or about 156K connections. This amounts to nearly a 65% savings from the original V2500 architecture, and an extra 30% savings over the FIG. 4 embodiment.

Other devices having a different number of input pins, input/output pins, I/O macrocells, buried macrocells and having macrocells with different product term requirements than the example given above could also be constructed. The savings in total programmable connections would vary from example to example, but are expected to have similar results.

We claim:

1. A programmable logic device comprising:
   a plurality of logic cells adapted for receiving product term signals and producing data signals in response to said product term signals,
   bus means for carrying signals thereon and producing said product term signals in response to said carried signals, said bus means including a global bus capable of communicating with all of said logic cells and a plurality of local busses each capable of communicating with only some of said logic cells, said bus means also including a set of product term lines capable of programmably communicating with signals carried on said busses to produce and carry said product term signals to said logic cells,
   each global product term line in said set communicating with said global bus and at least one of said local busses, each local product term line in said set communicating with only a proper subset of the signals carried by said busses that communicate with said global product term lines, each of said logic cells receiving product term signals from both said global product term lines and said local product term lines,
   means for transferring signals into and out of the programmable logic device, said transferring means communicating with said bus means to provide at least some of said signals carried by said busses, said transferring means also communicating with at least some of said logic cells to transmit some of said data signals produced thereby out of said device.

2. The device of claim 1 wherein said logic cells are organized in groups, each local bus being assigned to one of said groups of logic cells.

3. The device of claim 2 wherein each of said global product term lines communicating with logic cells of a particular group also communicates with all of said signals carried by said global bus and with said signals carried by at least one said local bus assigned to said particular group, each of said local product term lines communicating with the same group of logic cells also communicating with said signals carried by said local bus assigned to said particular group.

4. The device of claim 3 wherein said global product term lines further communicate with signals carried by at least one additional local bus and said local product term lines further communicate with a portion of the signals carried by said global bus.

5. The device of claim 2 wherein each of said logic cells feeds back data signals to said local bus assigned to its group.

6. The device of claim 1 wherein said means for transferring signals includes a set of input pins for receiving signals from outside of said programmable logic device and providing said received signals to a bus, and a set of input/output pins for selectively receiving signals from outside of said device or transmitting signals output by a logic cell to the outside of said device.

7. The device of claim 6 wherein said input pins connect to each local bus and said input/output pins connect to said global bus.

8. The device of claim 6 wherein said input pins and said input/output pins connect to said global bus.

9. A programmable logic device comprising:
   a plurality of logic cells adapted for receiving product term signals and producing data signals in response to said product term signals, said logic cells being organized into groups,
   bus means for carrying signals thereon and producing said product term signals in response to said carried signals, said bus means including a global bus capable of communicating with all of said logic cells and a plurality of local busses, each local bus assigned to and capable of communicating with only one group of logic cells, said bus means also including a set of product term lines capable of programmably communicating with signals carried on said busses to produce said product term signals and carry said product term signals to said logic cells with which said busses communicate,
   said set of product term lines including global product term lines and local product term lines, each global product term lines in said set communicating with said global bus and with the particular local bus assigned to the group of logic cells with one of which that global product term line communicates, each local product term line in said set communicating only with the particular local bus assigned to the group of logic cells with one of which that local product term line communicates, each logic cell receiving product term signals from both global and local product term lines,
   means for transferring signals into and out of the programmable logic device, said transferring means communicating with said bus means to provide at least some of said signals carried by said busses, said transferring means also communicating with at least some of said logic cells to transmit data signals produced thereby out of the device.

10. The device of claim 9 wherein each of said logic cells feeds back data signals to the local bus assigned to its group.

11. The device of claim 9 wherein said transferring means includes input pins for receiving signals from outside of said device and provide the received signals to each of said local busses.

12. The device of claim 9 wherein said transferring means includes input/output pins connected to said global bus.

13. The device of claim 9 wherein said product term lines intersect input lines carrying signals on said busses at programmable interconnections.

14. A programmable logic device comprising:
a plurality of logic cells adapted for receiving product term signals and producing data signals in response to said product term signals, said logic cells being organized into groups,
bus means for carrying signals thereon and producing said product term signals in response to said carried signals, said bus means including a global bus capable of communicating with all of said logic cells and a plurality of local busses, each local bus assigned to one group of logic cells and capable of communicating with logic cells in its assigned group and at least some, but not all, other logic cells, said bus means also including a set of product term lines capable of programmably communicating with signals carried on said busses to produce said product term signals and carry said product term signals to said logic cells with which said busses communicate,
said set of product term lines including global product term lines and local product term lines, each global product term line in said set programmably communicating with all of the signals on said global bus, with the particular local bus assigned to the group of logic cells with one of which that global product term line communicates and with at least one, but not all, other local bus, each local product term line in said set programmably communicating with the particular local bus assigned to the group of logic cells with one of which that local product term line communicates and with a portion of the signals on said global bus, each logic cell receiving product term signals from both global and local product term lines,
means for transferring signals into and out of the programmable logic device, said transferring means communicating with said bus means to provide at least some of said signals carried by said busses, said transferring means also communicating with at least some of said logic cells to transmit data signals produced thereby out of the device.

15. The device of claim 14 wherein each of said logic cells feeds back data signals to the local bus assigned to its group.

16. The device of claim 14 wherein said transferring means includes input pins for receiving signals from outside of said device and input/output pins for selectively receiving or transmitting signals into or out of said device, said pins connected to provide received signals to said global bus.

17. The device of claim 14 wherein said product term lines intersect input lines carrying signals on said busses at programmable interconnections.

18. A programmable logic device comprising:
a set of input pins for receiving input signals,
a set of input/output pins for selectively receiving input signals or transmitting output signals,
a plurality of logic cells arranged in groups of logic cells, some of said logic cells in a group being input/output cells, each input/output cell connected to an input/output pin for transmitting a data signal from said input/output cell as an output signal at said input/output pin, others of said logic cells in a group being buried cells, each buried cell being unconnectable to an input/output pin, at least some of said logic cells, including each of said buried cells, providing a feedback signal on feedback lines, each of said logic cells having cell inputs for receiving product term signals, said logic cells being responsive to said product term signals on said cell inputs so as to produce said data and feedback signals,
a programmable AND array for producing said product term signals to be provided to said cell inputs of said logic cells, said AND array including a set of input lines and a set of product term lines intersecting at least some of said input lines at programmable interconnections,
said set of input lines including a set of global input lines and plural sets of local input lines, said set of global input lines intersecting at least one product term line connecting to a cell input for each of said plurality of logic cells, each set of local input lines intersecting at least one product term line connecting to a cell input for each logic cell in only one group of logic cells,
said set of product term lines including global product term lines and local product term lines, each global product term line connected to a cell input of a logic cell and intersecting both said set of global input lines and one set of local input lines corresponding to the group to which said logic cell connected to said global product line belongs, each local product term line connected to a cell input of a logic cell and intersecting only the one set of local input lines corresponding to the group to which said logic cell connected to said local product term line belongs, each logic cell being connected at said cell inputs to at least one global product term line and at least one local product term line, and
a set of input busses, said set of input busses including a global bus and a plurality of local busses, said global bus connecting to said set of global input lines and to said set of input/output pins for carrying any input signals received at said input/output pins to said global input lines, each local bus connecting to one of said sets of local input lines and to said input pins for carrying input signals received at said input pins to said local input lines, each local bus also connecting to a set of feedback lines from said logic cells of the same group to which said local input lines connected to said local bus correspond for carrying feedback signals from said logic cells to said local input lines.

19. The programmable logic device of claim 18 wherein at least one line of said global bus is switchably connectable to a selected one of an input/output pin and a logic cell, whereby said line of said global bus is capable of receiving a data signal from said logic cell instead of an input signal from said input/output pin and transmitting said data signal to a global input line.

20. A programmable logic device comprising:
a set of input pins for receiving input signals,
a set of input/output pins for selectively receiving input signals or transmitting output signals,
a plurality of logic cells arranged in groups of logic cells, some of said logic cells in a group being input/output cells, each input/output cell connected to an input/output pin for transmitting a data signal from said input/output cell as an output signal at said input/output pin, others of said logic cells in a group being buried cells, each buried cell being unconnectable to an input/output pin, at least some of said logic cells, including each of said buried cells, providing a feedback signal on feedback lines, each of said logic cells having cell inputs for receiving product term signals, said logic cells being responsive to said product term signals on said cell inputs so as to produce said data and feedback signals, a programmable AND array for producing said product term signals to be provided to said cell inputs of said logic cells, said AND array including a set of input lines and a set of product term lines intersecting at least some of said input lines at programmable interconnections, said set of input lines including a set of global input lines organized into a number of portions, said set of input lines also including plural sets of local input lines, said set of global input lines intersecting at least one product term line connecting to a cell input for each of said plurality of logic cells, each set of local input lines intersecting at least one product term line connecting to a cell input for each logic input in only some of the groups of logic cells, said set of product term lines including global product term lines and local product term lines, each global product term line connected to a cell input of a logic cell and intersecting the entire set of global input lines, the set of local input lines corresponding to the group to which said logic cell connected to said global product term line belongs and to at least one, but not all, other set of local input lines, each local product term line connected to a cell input of a logic cell and intersecting only one portion of global input lines in said set of global input lines and only the one set of local input lines corresponding to the group to which said logic cell connected to said local product term line belongs, each logic cell being connected at said cell inputs to at least one global product term line and at least one local product term line, and a set of input busses, said set of input busses including a global bus and a plurality of local busses, said global bus connecting to said set of global input lines, each local bus connecting to one of said sets of local input lines, said global bus connected to said set of input pins and to said set of input/output pins for carrying input signals received by said input pins and any input signals received by said input/output pins selected for input to said global input lines, each local bus connecting to a set of feedback lines from said logic cells of the same group to which said local input lines connected to said local bus correspond for carrying feedback signals from said logic cells to said local input lines.

21. The programmable logic device of claim 20 wherein a line of said global bus is switchably connectable to a selected one of an input/output pin and a logic cell, whereby said line of said global bus is capable of receiving a data signal from said logic cell instead of an input signal from said input/output pin and transmitting said data signal to a global input line.

* * * * *